United States Patent [19]
Lee et al.

[11] Patent Number: 5,686,339
[45] Date of Patent: Nov. 11, 1997

[54] HIGH DIELECTRIC CONSTANT CAPACITOR AND A FABRICATING METHOD THEREOF

[75] Inventors: Chang-Jae Lee; Hwan Myeong Kim, both of Choongchungbook-Do, Rep. of Korea

[73] Assignee: LG Semicon Co., Ltd., Choongchungbook-do, Rep. of Korea

[21] Appl. No.: 689,155

[22] Filed: Jul. 30, 1996

[30] Foreign Application Priority Data

Oct. 18, 1995 [KR] Rep. of Korea ............... 35981/1995

[51] Int. Cl.$^6$ ............................................. H01L 21/70
[52] U.S. Cl. ............................. 437/52; 437/60; 437/919
[58] Field of Search ............................. 437/52, 60, 919; 257/310

[56] References Cited

U.S. PATENT DOCUMENTS

| | | | |
|---|---|---|---|
| 5,188,975 | 2/1993 | Kojima et al. | 437/48 |
| 5,484,744 | 1/1996 | Hong | 437/52 |
| 5,489,548 | 2/1996 | Nishioka et al. | 437/60 |
| 5,534,458 | 7/1996 | Okudaira et al. | 437/52 |

*Primary Examiner*—R. Bruce Breneman
*Assistant Examiner*—Michael E. Adjodha
*Attorney, Agent, or Firm*—Morgan, Lewis & Bockius LLP

[57] ABSTRACT

A method for fabricating a capacitor of a semiconductor device, includes the steps of: forming a first insulating layer and then a second insulating layer on the first insulating layer; removing the second insulating layer of a first electrode region of a capacitor; forming a side wall at a side of the second insulating layer; etching the first insulating layer by using the side wall of the second insulating layer as a mask so as to form a contact hole; forming a first electrode of a capacitor on the side wall and on the contact hole; forming a dielectric layer on the first electrode of the capacitor; and forming a second electrode of the capacitor on the dielectric layer. And, a capacitor in a semiconductor device includes: a substrate; a first insulating layer being formed at an upper part of the substrate 20 and having a contact hole; a second insulating layer being formed at an upper part of the first insulating layer; side walls being formed at an upper part of the first insulating layer and at a side surface of the second insulating layer both in an arc-shape; a first electrode of a capacitor being formed on the contact hole and the side walls; a dielectric layer formed on the first electrode of the capacitor; and a second electrode of the capacitor being formed on the first electrode of the capacitor.

20 Claims, 6 Drawing Sheets

HIGH DIELECTRIC CONSTANT CAPACITOR AND A FABRICATING METHOD THEREOF

BACKGROUND OF THE INVENTION

1. Field of the Invention

The present invention relates to a high dielectric constant capacitor and a fabricating method thereof, and more particularly to a high dielectric constant capacitor and its fabricating method in a semiconductor DRAM (Dynamic Random Access Memory) device.

2. Description of the Prior Art

Recently, 16 Mbits and 64 Mbits DRAM devices are being mass-produced, and a sample for a 1 Gbit DRAM device is being actively developed. As an integration density of the DRAM is increased, cell size on a plane aspect is reduced. Generally, with the reduction of the cell size, the capacitance and thus the charge storage capacity of the cell is reduced. Also, owing to the reduction of the capacitance, risk of a soft error caused due to incidence of an α-ray would be increased. For those reasons, it is preferable to reduce the size of a charge storage capacitor on a plane aspect rather than reducing the capacitance of the DRAM.

To meet such a requirement, a stacked capacitor type DRAM device has been proposed.

FIG. 1 shows a conventional stacked capacitor type DRAM device, in which a semiconductor substrate 1 includes an FET transistor (not shown) having a pair of gate electrodes 2a and 2b. An insulating layer 3 is formed on the FET transistor and on the gate electrodes 2a and 2b. A capacitor 5 is stacked on the insulating layer 3. A polysilicon plug 6 is formed in a contact hole formed on a source or drain region 4 of the FET transistor through the insulating layer 3.

The capacitor 5 includes a lower electrode 8, an upper electrode 9 and a dielectric film 10 formed therebetween. The dielectric film 10 is made of a high dielectric constance substance such as $BaSrTiO_3$. The capacitor 5 includes a barrier layer 11 formed between the lower electrode 8 and the polysilicon plug 6. The barrier layer 11 is made of a conductive material such as Ta or TiN.

The stack-type capacitor as constructed above has the following problems. First, the dielectric film 10 should be provided with a step-type surface due to a stack formed by the lower electrode 8 and the barrier layer 11. Also, due to the step coverage of the dielectric substance over the lower electrode 8, charge leakage may occur at corners 13 and 14 of the dielectric film 10 in a completed capacitor structure. Thus, an insulating layer such as $SiO_2$ is frequently deposited at outer corners of the dielectric film 10.

Secondly, side walls 15 and 16 of the barrier layer 11 are exposed to oxidation while the dielectric film 10 is being deposited. Accordingly, a high temperature during the dielectric deposition step causes the side wall of the barrier layer 11 to be oxidized and such oxide causes an increase in a contact resistance of the barrier layer 11. Also, since the oxide is formed on the side walls 15 and 16 of the barrier layer 11, the lower electrode 8 is not easily attached on the barrier layer 11.

Consequently, if the barrier layer 11 could not completely overlap the polysilicon plug 6, the surface of the polysilicon plug 6 would be oxidized during the deposition of the dielectric film 10. In order to avoid this, a central alignment of the polysilicon plug 6 and the barrier layer 11 is required.

SUMMARY OF THE INVENTION

Therefore, an object of the present invention is to provide a high dielectric constant film capacitor and its fabricating method suitable to a high-integration DRAM capacitor.

Another object of the present invention is to provide a high dielectric constant film capacitor and its fabricating method by using a single masking step.

A still further object of the present invention is to provide a capacitor and its fabricating method capable Of preventing inferiority of a device due to a misalignment by rendering node contact holes to be automatically aligned.

In order to attain the above objects, there is provided a method for fabricating a capacitor of a semiconductor device including the steps of forming a first insulating layer and then a second insulating layer on the first insulating layer; removing the second insulating layer of a first electrode region of a capacitor; forming a side wall at a side of the second insulating layer; etching the first insulating layer by using the side wall of the second insulating layer as a mask so as to form a contact hole; forming a first electrode of a capacitor on the side wall and on the contact hole; forming a dielectric layer on the first electrode of the capacitor; and forming a second electrode of the capacitor on the dielectric layer.

In order to attain the above objects, there is also provided a capacitor of a semiconductor device including a substrate; a first insulating layer being formed at an upper part of the substrate and having a contact hole; a second insulating layer being formed at an upper part of the first insulating layer; side walls being formed at an upper part of the first insulating layer and at a side surface of the second insulating layer both in an arc-shape; a first electrode of a capacitor being formed on the contact hole and the side walls; a dielectric layer formed on the first electrode of the capacitor; and a second electrode of the capacitor formed on the capacitor first electrode.

DETAILED DESCRIPTION OF THE INVENTION

A preferred embodiment of the present invention will now be described in detail with reference to the accompanying drawings.

Figure 1:
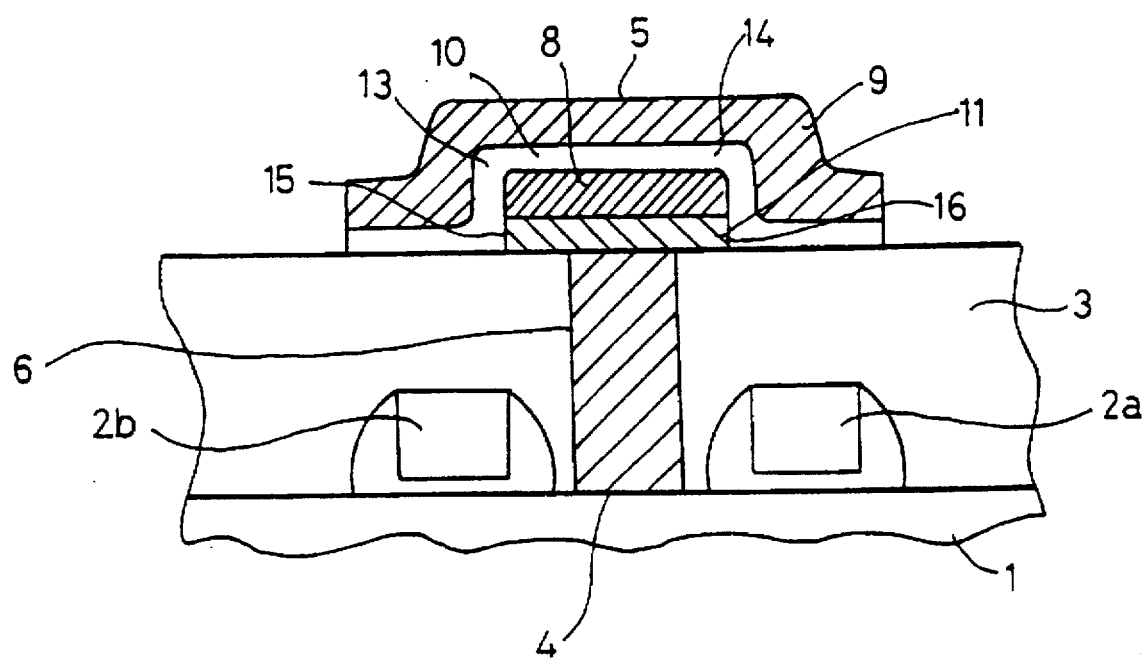
FIG. 1 is a schematic cross-sectional view of a conventional capacitor having a high dielectric constant.
Figure 2A:
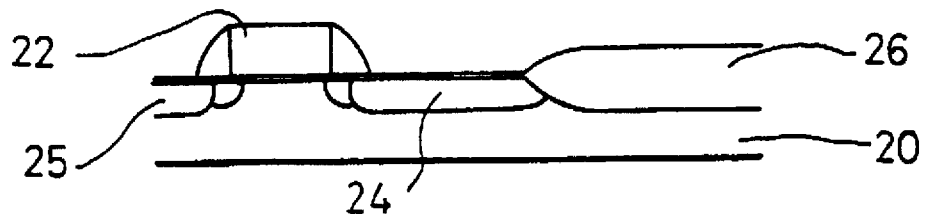
FIGS. 2A to 2K are cross-sectional views showing steps of a method for fabricating a capacitor in accordance with one embodiment of the present invention.

Referring to FIG. 2A, there are formed on a substrate 20 a gate electrode 22, $n^+$-type impurity diffusion regions 24 and 25 and a field oxidation film 26 on a substrate 20.

Figure 2B:
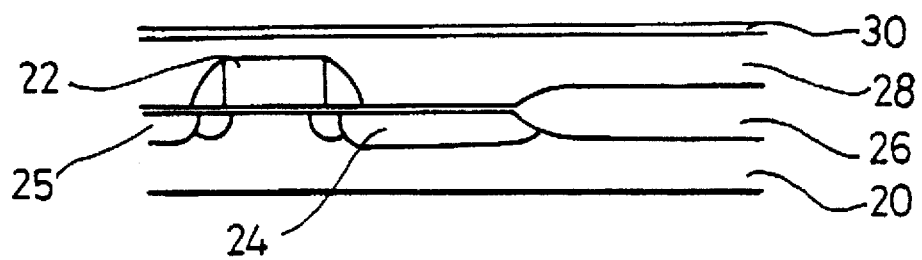

Then, as shown in FIG. 2B, a first insulating layer 28 is deposited on the substrate 20 including the gate electrode 22 and the field oxide layer 26 by a CVD (Chemical Vapor Deposition) process in a thickness of a 3000 Å. And then, a first silicon nitride layer 30 is deposited at an upper part of the first insulating layer 28 by a LPCVD (Lower Pressure Chemical Vapor Deposition) process in a thickness of 300 Å.

Figure 2C:
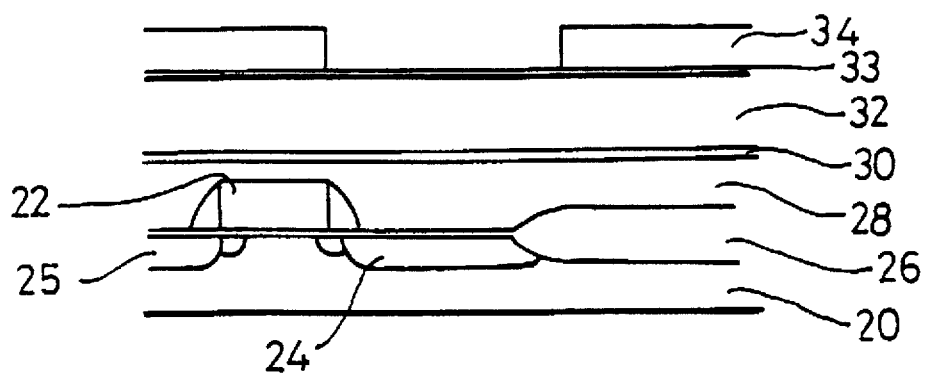

At an upper part of the first silicon nitride layer 30, as shown in FIG. 2C, there are formed a second insulating layer 32 and a second silicon nitride layer 33. The second insulating layer 32 is deposited in a thickness of 4,000 Å by a CVD silicon oxide (SiO$_2$) process, and the second silicon nitride layer 33 is deposited in a thickness of 500 Å by the CVD process. Then, a photoresist 34 is formed at an upper part of the second silicon nitride layer 33 so as to be used as a mask. That is, in order to form a capacitor storage electrode, a region for forming a capacitor storage node is confined by a photolithography process as shown in FIG. 2C.

Figure 2D:
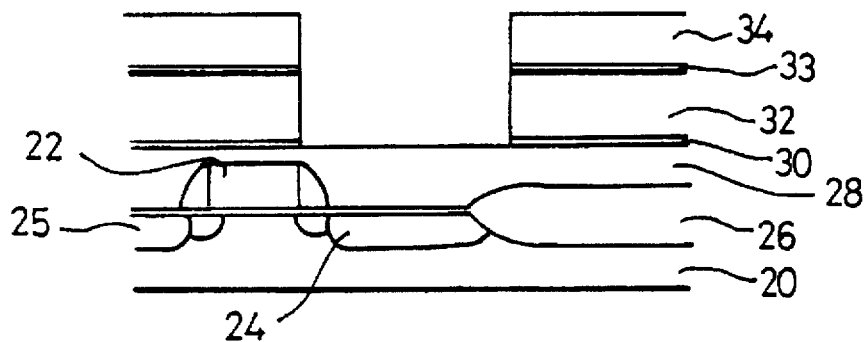

Thereafter, as shown in FIG. 2D, the exposed second silicon nitride layer 33 and the second insulating layer 32 are etched by a RIE (Reactive Ion Etchanting) process by using an etchant, and the first silicon nitride layer 30 is kept etching until when it is exposed. Then, the photoresist 34 is dipped into a H$_2$O$_2$/H$_2$SO$_4$ solution to strip it.

Figure 2E:
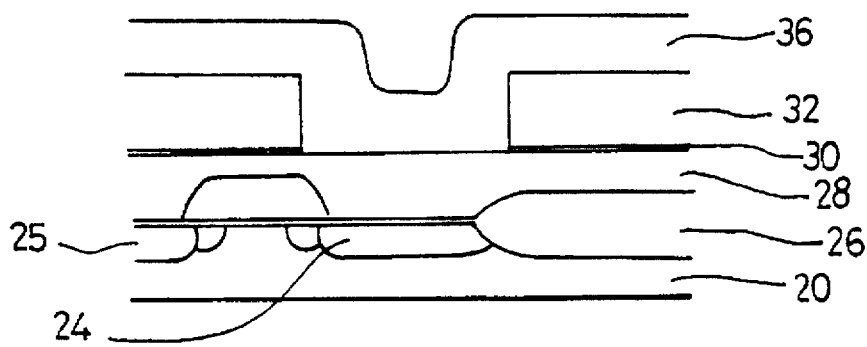

A polysilicon layer 36 is deposited at an upper part of the first and second insulating layers 28 and 32, as shown in FIG. 2E, in a thickness of 1,500 Å by using the LPCVD process.

Figure 2F:
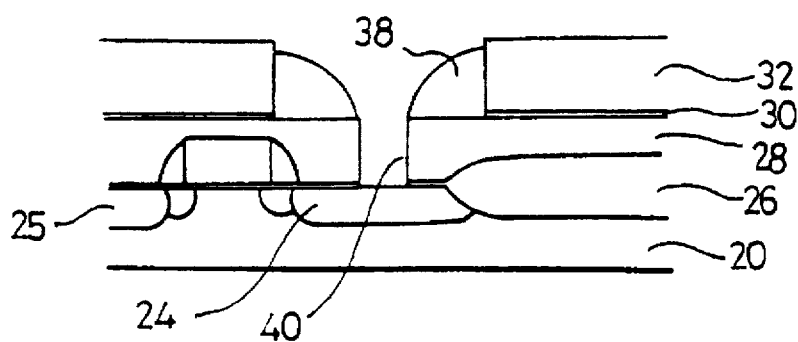

Thereafter, the polysilicon layer 36 is etched by the reactive ion etching method using HBr/Cl$_2$ as an etchant. At this time, as shown in FIG. 2F, arc-shape side walls 38 are formed at both sides of the second insulating layer 32. The side walls 38 are preferably made of a polysilicon, and are used as a mask to etch the first insulating layer 28. At this time, the first silicon nitride layer 30 and the first insulating layer 28 are respectively etched by using a gas containing much carbon such as C$_2$F$_6$ or C$_3$H$_8$ by adapting an ICP (Inductively Coupled Plasma) process, that is, using a high density plasma source having a great etching selectivity.

Figure 2G:
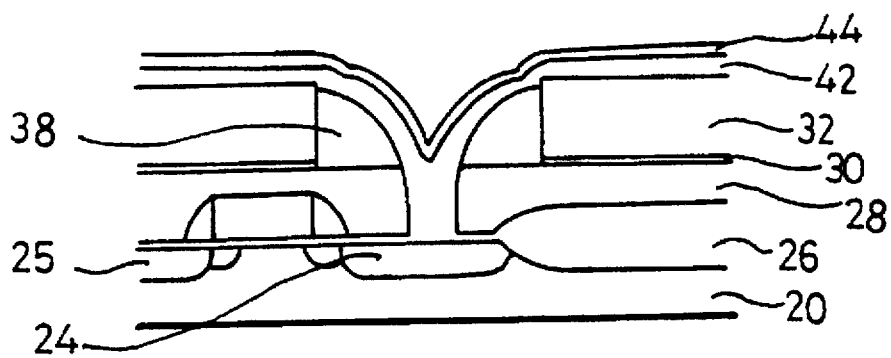

As shown in FIG. 2G, a first electrode of a capacitor is formed at upper parts of the side wall 38 and the contact hole 40. That is, the first electrode of the capacitor includes a barrier layer (that is, a TiN layer 42) and a conductive layer (that is, a Pt layer 44) which would hardly be oxidized. In detail, the TiN (Titanium Nitride) layer 42, a diffusion barrier material, is deposited at upper parts of the side wall 38 and the contact hole 40 in a thickness of 1,000 Å by using the CVD process. The TiN layer 42 may be substituted by a layer of Ta or W.

Thereafter, the platinum layer 44 is deposited in a thickness 500 Å by using a sputtering process, which layer 44 may be also substituted by one of RuO$_2$, Ir Oxide or Indium oxide.

Figure 2H:
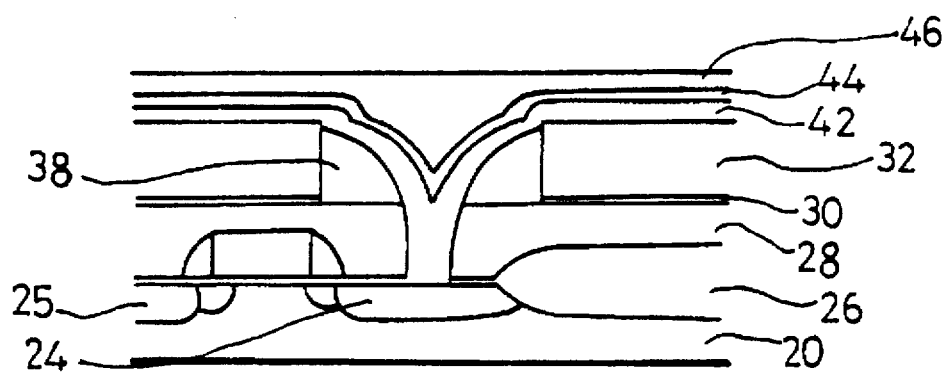

And, as shown in FIG. 2H, an SOG (Silicon On Glass) layer 46 is evenly deposited on the entire surface of the Pt layer 44. A photoresist (not shown) can be deposited instead of the SOG layer 46.

Figure 2I:
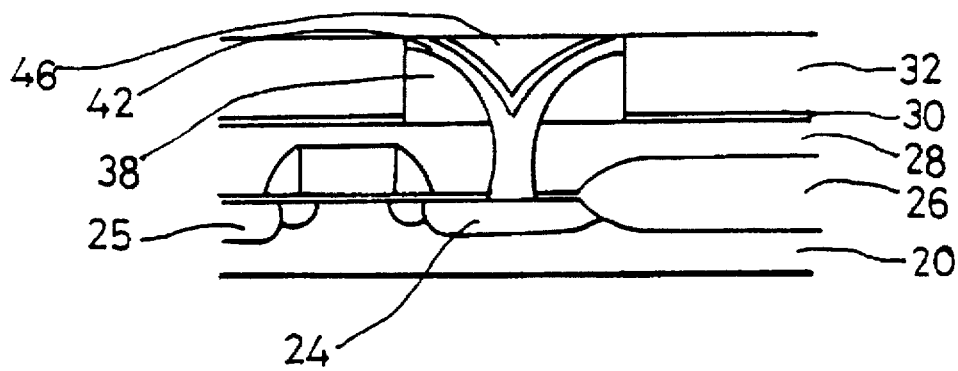

Then, as shown in FIG. 2I, etching-back is performed by using a chemical mechanical polishing or an RIE (Reactive Ion Etching) process. In this respect, the SOG layer 46 is etched by using CHF$_3$/CF$_4$ gas as an etchant, the Pt layer 44 is etched by using HBr/Ar gas as an etchant, and the TiN layer 42 is etched by using BCl$_3$/Cl$_2$ gas as an etchant. In case of using the photoresist layer (not shown) therefor, O$_2$/Ar is used as an etchant therefor.

Figure 2J:
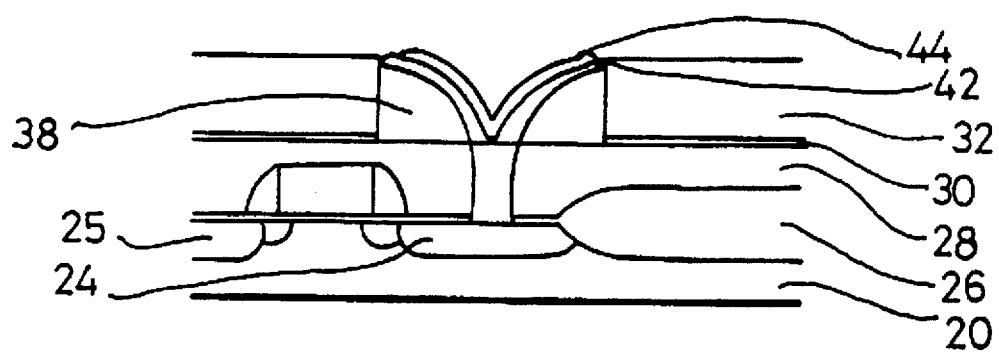

The remaining SOG layer 46 formed at a node region as shown in FIG. 2I is dipped in HF so as to be removed as shown in FIG. 2J. In this respect, in case of using the photoresist layer, the layer 46 is dipped in CH$_3$COOH/NH$_4$OH/H$_2$O to be removed, after a dry strip.

Figure 2K:
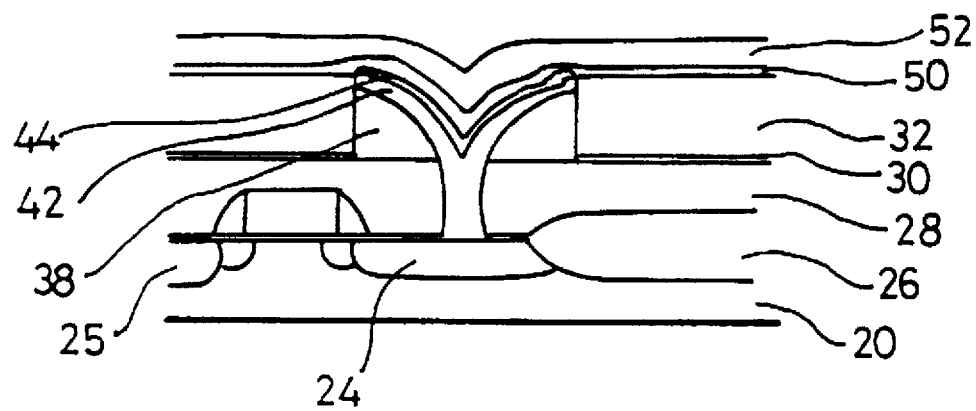

Thereafter, as shown in FIG. 2K, a high dielectric layer 50, one of non-conductive layers, is deposited on the Pt layer 44 and the second insulating layer 32 by using the CVD or sputtering process. The high dielectric layer 50 is formed by one of an oxide having a single metal and a single oxygen or a compound oxide having plural metals and oxygens, for instance, such as Ta$_2$O$_5$, BaSrTiO$_3$, BaTiO$_3$, PbzrO$_3$, PZT, PIZT, or a substance selected from the group of an inorganic insulating metal oxide.

An upper electrode (that is, the second electrode of the capacitor) 52 is deposited at an upper part of the high dielectric layer 50.

By adopting the method for fabricating the capacitor of the semiconductor device in accordance with the present invention, the capacitor can be fabricated by using a single masking step, so that the entire process can be simplified.

Figure 3:
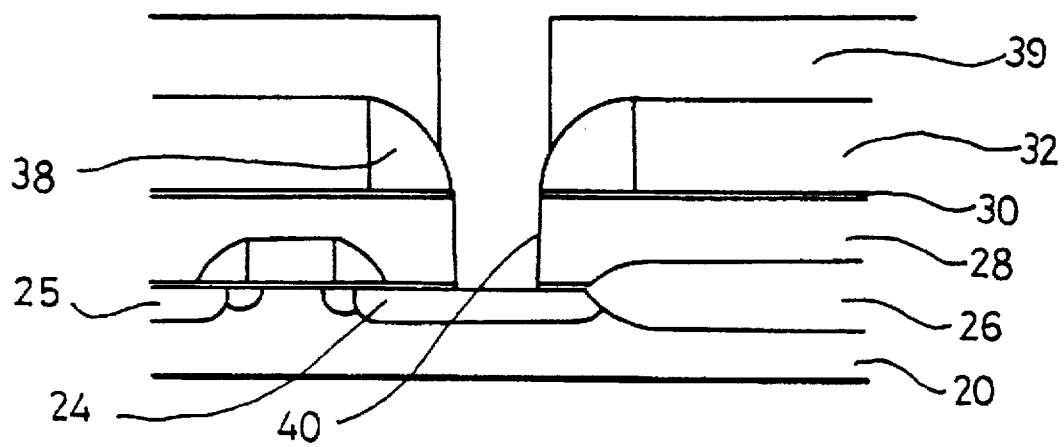
FIG. 3 is a cross-sectional view showing another embodiment of the present invention.

FIG. 3 shows another embodiment of a formation of a contact hole in accordance with the present invention.

First, as shown in FIG. 3, a photoresist 39 is formed on side walls 38 and the second insulating layer 32, and then a contact hole 40 is formed by etching the first silicon nitride layer 30 and the first insulating layer 28 by using the side walls 38 and the photoresist 39 as masks. The other steps thereafter are the same as those of the previously described embodiment.

Figure 4:
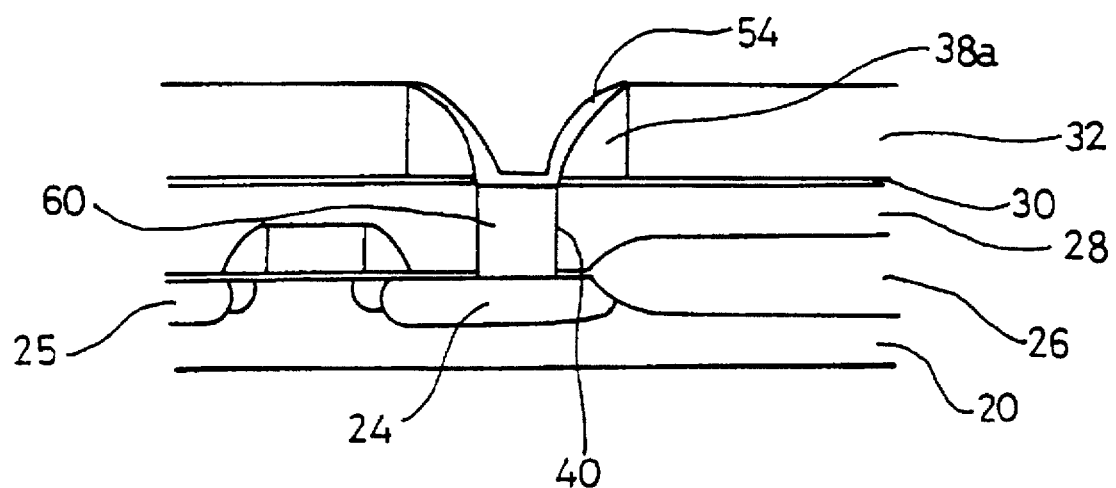
FIG. 4 is a cross-sectional view showing still another embodiment of the present invention.

FIG. 4 shows a still further embodiment of the present invention using a barrier layer in the contact hole. As shown in FIG. 4, after the contact hole 40 is formed, a barrier layer 60 is deposited at a portion corresponding to the contact hole 40 and etched back so as to have a plug structure. The barrier layer 60 is a TiN layer. Then, a Pt layer 54 is formed on an upper part of the barrier layer 60 and the side walls 38a. Further steps thereafter are performed in the same manner as the steps performed after the step of FIG. 2H.

The structure of the capacitor of the semiconductor device in the present invention will now be described.

As shown in FIGS. 2A to 2K, the capacitor according to the present invention includes a substrate 20; a first insulating layer 28 being formed at an upper pan of the substrate 20 and having a contact hole 40; a second insulating layer 32 being formed at an upper part of the first insulating layer 28; side walls 38 being formed at an upper pan of the first insulating layer and at a side surface of the second insulating layer 32 in an arc-shape; a first electrode of a capacitor being formed on the contact hole and the side walls; a dielectric layer 50 formed on the first electrode of the capacitor; and a second electrode of the capacitor 52 being formed on the first electrode of the capacitor.

As so far described, in the capacitor structure and its fabricating method according to the present invention, the CMP method is simply performed instead of using a conventional etching process (that is, etching of Pt/TiN multi-structure), so that the entire process can be simplified. Also, since the node contact holes are automatically aligned, any defect in the device caused due to a misalignment can be reduced. In addition, as to the capacitor according to the present invention, since the structure of the electrodes has a slope with the same angles with each other, the area of the electrodes is increased, so that its capacitance is accordingly increased.

What is claimed is:

1. A method for fabricating a capacitor of a semiconductor device, comprising the steps of:

forming a first insulating layer on a substrate;

forming a silicon nitride layer on the first insulating layer;

forming a second insulating layer on the silicon nitride layer;

removing the second insulating layer at a first electrode region of the capacitor;

forming a side wall at a side of the second insulating layer;

etching the first insulating layer to form a contact hole by using the side wall as a mask;

forming a first electrode of the capacitor on the side wall and on the contact hole;

forming a dielectric layer on the first electrode of the capacitor; and forming a second electrode of the capacitor on the dielectric layer.

2. The method according to claim 1, wherein the substrate includes a gate electrode and a field oxide layer.

3. The method according to claim 1, wherein the first insulating layer is deposited in a thickness of 3,000 Å.

4. The method according to claim 1, wherein the silicon nitride layer is deposited in a thickness of 300 Å.

5. The method according to claim 1, wherein, after the second insulating layer is formed, a second silicon nitride layer is formed at an upper part thereof.

6. The method according to claim 5, wherein a photoresist is formed at an upper part of the second silicon nitride layer.

7. The method according to claim 6, wherein the photoresist is dipped in $H_3O_2/H_2SO_4$ solution so as to be removed.

8. The method according to claim 5, wherein the second silicon nitride layer is deposited in a thickness of 500 Å.

9. The method according to claim 5, wherein the second silicon nitride layer is etched by a PIE method by using $CHF_3/CF_4$ as an etchant.

10. The method according to claim 1, wherein, in the step for removing the second insulating layer, the second insulating layer is etched by the PIE method by using $CHF_3/CF_4$ as an etchant.

11. The method according to claim 1, further including a step for forming a polysilicon layer on the first insulating layer, after the step of selectively removing the second insulating layer.

12. The method according to claim 11, wherein the polysilicon layer has a thickness of 1,500 Å.

13. The method according to claim 1, wherein the side wall formed on the second insulating layer is of an arc-shape.

14. The method according to claim 1, wherein the first electrode of the capacitor includes a conductive barrier layer and a conductive layer which resists oxidation.

15. The method according to claim 14, wherein the barrier layer is one selected from TiN, Ta or W.

16. The method according to claim 14, wherein the conductive layer is one selected from Pt, $RuO_2$, Ir Oxide or Indium Oxide.

17. The method according to claim 1, wherein the dielectric layer is one selected from $Ta_2O_5$, $BaSrTiO_3$, $BaTiO_3$, $PbzrO_3$, PZT, PIZT, or a substance selected from the group comprising inorganic insulating metal oxides.

18. The method according to claim 1, wherein the second electrode is one selected from Pt or W.

19. A capacitor in a semiconductor device, comprising:
   a substrate;
   a first insulating layer formed at an upper part of the substrate and having a contact hole;
   a silicon nitride layer formed at an upper part of the first insulating layer;
   a second insulating layer formed on the silicon nitride layer;
   side walls formed at an upper part of the first insulating layer and at a side surface of the second insulating layer, the side walls having an arc-shape;
   a first electrode of the capacitor formed on the contact hole and the side walls;
   a dielectric layer formed on the first electrode; and
   a conductive second electrode formed on the dielectric layer.

20. The capacitor according to claim 19, wherein the side walls are made of a conductive substance such as a polysilicon.

* * * * *

UNITED STATES PATENT AND TRADEMARK OFFICE
CERTIFICATE OF CORRECTION

PATENT NO. : 5,686,339
DATED : November 11, 1997
INVENTOR(S) : Chang-Jae LEE et al.

It is certified that error appears in the above-indentified patent and that said Letters Patent is hereby corrected as shown below:

Col. 5, line 28, change "PIE" to --RIE--.
Col. 5, line 32, change "PIE" to --RIE--.
Col. 6, line 2, change "wail" to --wall--.

Signed and Sealed this

Twenty-seventh Day of October, 1998

Attest:

BRUCE LEHMAN

*Attesting Officer*  *Commissioner of Patents and Trademarks*